Feb. 22, 1966 W. B. EDWARDS, JR 3,237,026
INVERTER CIRCUIT
Filed Feb. 14, 1963
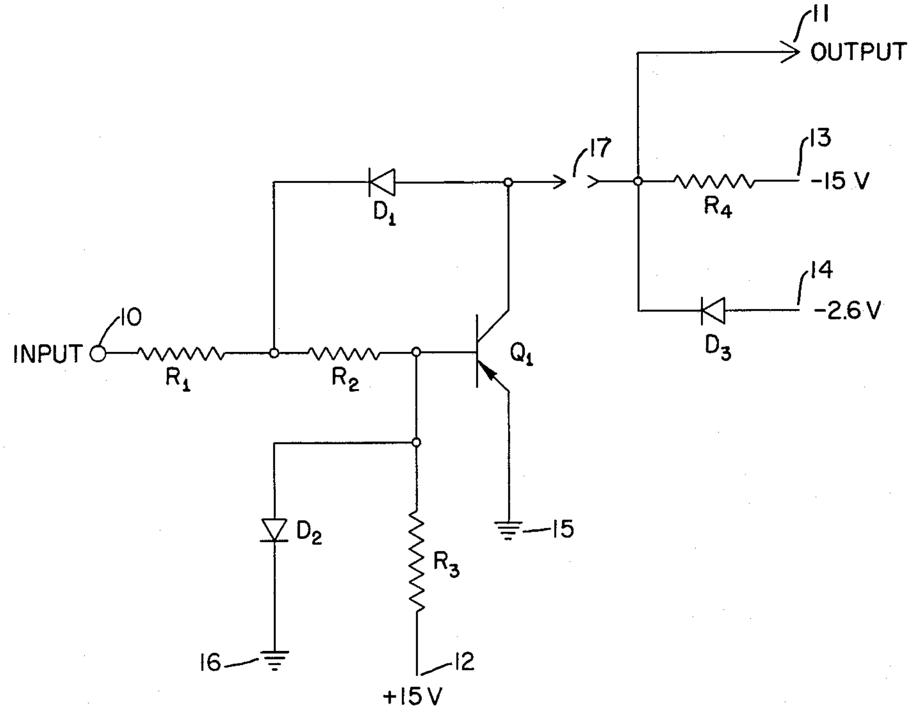
INVENTOR.
WALLACE B. EDWARDS, JR.
BY Philip H. Sheridan
ATTORNEY United States Patent Office 3,237,026

Patented Feb. 22, 1966

3,237,026

INVERTER CIRCUIT

Wallace B. Edwards, Jr., Minneapolis, Minn., assignor to Uptime Corporation, Golden, Colo., a corporation of Wyoming Filed Feb. 14, 1963, Ser. No. 258,539
3 Claims. (Cl. 307—88.5)

This invention relates to a circuit of the type which receives an input voltage and produces an output voltage at a different level in accordance with the transfer function of the circuit.

The single inverter circuit of this invention can be used to implement the logic of any digital system, computers, card readers, and the like.

Stated in general terms, the circuit of this invention includes a transistor for providing a desired signal gain and inversion of the circuit. A feedback loop, including a feedback diode and a feedback reference resistor, is coupled to the transistor. The feedback diode serves to limit the base current of the transistor, thereby preventing transistor saturation, and storage time in the transistor. In addition, the feedback diode effectively gives the inverter circuit a desired, substantially constant gain. The feedback reference resistor matches the transistor and feedback diode transfer functions. A voltage clamping diode is coupled to the feedback loop to provide a desirable fall time "speed up" by virtue of its clamp voltage and a working load voltage, applied to a circuit load resistor, which also is connected to the feedback loop and connected in parallel with the voltage clamping diode. By clamping the collector of the transistor to a given voltage level, with the transistor in the turn-off mode, the voltage clamping diode prevents collector-emitter punch-through of the transistor.

Additional features and objects of the invention will become apparent from the following detailed description, which is given primarily for purposes of illustration and not limitation. The description is given with reference to the accompanying drawing, which shows a schematic circuit diagram of a specific embodiment of the invention. The various components of the circuit have the following circuit values:

$R_1$=1000 ohms ±2%
$R_2$=300 ohms ±2%
$R_3$=18000 ohms ±2%
$R_4$=750 ohms ±5%
$D_1$, $D_2$ and $D_3$ are IN914 diodes
$Q_1$ is a 2N711A transistor During operation of this specific inverter circuit of the invention, the various components thereof serve the following various purposes. The 1000 ohm resistor, $R_1$ serves two main purposes: (1) it limits the amount of current required from the circuit driving source, and (2) it acts as a "load" for the feedback loop, which contains transistor $Q_1$, diode $D_1$ and resistor $R_2$. The 300 ohm resistor $R_2$ is a feedback reference resistor which matches the transfer functions of transistor $Q_1$ and diode $D_1$. The 18000 ohm resistor $R_3$ provides the necessary return to a positive voltage to insure the turn-off mode of transistor $Q_1$ and the 750 ohm resistor $R_4$ is the load resistor for the circuit.

Diode $D_1$ is the feedback diode in the feedback loop described above. Its primary function is to limit the base current of transistor $Q_1$, thereby preventing transistor saturation, and storage time in the transistor. Secondly, it effectively gives the converter circuit a near constant gain. Diode $D_2$ prevents breakdown of transistor $Q_1$ during turn-on of D.C. voltages. It also maintains a low impedance in the base circuit of transistor $Q_1$ during turn-off of the transistor, thus providing good current switching characteristics in the transistor and minimizing the loss of transistor base drive current. In operation, as long as the input voltage is negative, the diode $D_2$ is reversed biased. Under these circumstances no current flows from 12 to the ground 16 and, thus, the transistor $Q_1$ is switched in the on or conducting position.

Diode $D_3$ provides an effective, desirable fall time "speed up" by virtue of its clamp voltage, about 2.6 or about −3 volts, and the working load voltage of −15.0 volts. By clamping the collector of transistor $Q_1$ to −3 volts, with the transistor in the turn-off mode, diode $D_3$ also effectively prevents collector-emitter punch-through in the transistor, which might otherwise occur. Transistor $Q_1$ is, of course, the acting element in the converter circuit which provides the signal gain and inversion necessary for circuit operation.

As shown in the drawing the single inverter circuit receives an input voltage at 10, having a level of either −3.0 volts ±10%, or a level of −0.4 volt ±10%, and produces an output voltage at 11 having a level in accordance with the transfer function of the circuit. The voltage level output of the circuit at 11, is an inversion, or complement, of the input voltage level at 10. Thus, if the input at 10 is at the level of −3.0 volts, the output of the circuit at 11 is at the level of −0.4 volt, and conversely, if the input at 10 is −0.4 volt, the output at 11 is at the level of −3 volts.

During operation of the single inverter circuit shown in the drawing, a positive voltage of +15 volts is applied at 12 to resistor $R_3$ and a working load voltage of −15 volts is applied at 13 to resistor $R_4$ for the purposes described above in discussing the circuit components. Similarly, a voltage of −2.6 volts is applied at 14 to diode $D_3$ so that the diode produces the desired fall time "speed up" and prevents collector-emitter transistor punch-through. The emitter of transistor $Q_1$ is grounded at 15 and diode $D_2$ is grounded at 16.

Two spaced arrowheads are shown in a connecting line at 17 to indicate a break in the line. The circuit to the left of 17 is called the "inverter" and the configuration to the right is termed the "node." Logical networks which employ the single inverter concept do ont use a uniquely connected inverter and node. A node may have from one to twenty-five inverters, connected to it, depending upon the particular logical function which is to be mechanized. This is the reason for the separation marks at 17.

Among the unique features of the single inverter circuit shown in the drawing is the fact that it has a fan-in equal to 25, i.e., the maximum number of inverter outputs that may be connected to any one node, and a fan-out equal to 8, i.e, the maximum number of inverter inputs that may be connected to any one node, and it maintains switching times which are considerably less, i.e., by a factor of about 5, than those otherwise obtained with the same active element; namely, transistor $Q_1$. This is achieved through the most salient feature of the single inverter circuit of this invention; namely, the feedback correction network consisting, in the specific embodiment of the drawing, of resistors $R_1$ and $R_2$, diode $D_1$ and transistor $Q_1$, and secondly through the low transistor base impedance maintained by diode $D_2$.

Instead of the PNP transistor $Q_1$ employed in the specific embodiment of the invention described hereinabove, an NPN transistor can be used by changing the polarity of the power supply voltages, i.e., − to + and + to −, and reversing the manner in which the diodes are connected into the circuit. Some adjustment of the precise values of the other components would be required. These adjustments are within the skill of the art. The configuration and operation of the circuit would remain as described in connection with the specific embodiment shown in the drawing and described hereinabove.

Other power supply voltages than the −15 and +15 volts can be used with the particular circuit configuration and operation given hereinabove, as desired, for compatibility with various systems. The particular circuit configuration also can be varied.

Obviously, many modifications and variations of the single inverter circuit of this invention are possible in the light of the teachings given hereinabove. It is, therefore, to be understood that, within the scope of the appended claims, the invention can be practiced otherwise than as specifically described.

What is claimed is:

1. A logic network comprising an inverter circuit including a transistor for providing a desired signal gain and inversion of the circuit, a feedback loop consisting of the transistor, a feedback diode connected to the collector of the transistor, and a feedback reference resistor connected in series with the feedback diode and connected to the base of the transistor, the feedback diode serving to prevent transistor saturation and to provide a substantially constant gain in the circuit and the feedback reference resisor serving to match the transistor and feedback diode transfer functions and a node configuration including a feedback load resistor connected to the feedback diode and the feedback reference resistor and in series with the feedback loop, the load resistor serving to limit the amount of current required for the circuit and as a load resistance for the feedback loop, a third resistor connected to the base of the transistor and the feedback reference resistor, the third resistor serving to provide the necessary return to a positive voltage to insure the turn-off mode of the transistor, a positive voltage source connected to the third resistor to maintain a desired positive voltage thereon, a second diode connected to the base of the transistor for maintaining a low impedance in the base circuit during turn-off of the transistor and to prevent breakdown of the transistor during turn-on, a voltage clamping diode in the node configuration connected to the collector of the transistor and the feedback diode in series with the feedback loop and in parallel with the circuit load resistor, the voltage clamping diode serving to speed up the fall time by clamping the transistor to a clamping voltage, negative voltage source connected to the circuit load resistor and to the voltage clamping diode to maintain desired negative voltages thereon, ground connections to the emitter of the transistor and to the second diode, a signal voltage input means connected to the feedback load resistor to introduce an input voltage level into the inverter circuit, and a signal voltage output means connected in series with the feedback loop to receive a voltage level which is an inversion or complement of the input voltage level.

2. An inverter circuit according to claim 1, wherein the positive voltage maintained on the third resistor is about +15 volts, the negative voltage maintained on the circuit load resistor is about −15 volts, the negative voltage maintained on the voltage clamping diode is about —2.6 volts, the input voltage level introduced into the inverter circuit is selected from the group of about −3.0 volts and about —0.4 volt and the output voltage level received from the inverter circuit is selected from the group of about —0.4 volt and about −3 volts respectively.

3. A logic network comprising an inverter circuit including a transistor for providing a desired signal gain and inversion of the circuit, a feedback loop coupled to the transistor and including a feedback diode and a feedback reference resistor, the feedback diode serving to prevent transistor saturation and the feedback reference resistor serving to match the transistor and feedback diode transfer functions, a second diode coupled to the base of the transistor for maintaining a low impedance in the base circuit during turn-off of the transistor and to prevent breakdown of the transistor during turn-on, and a node configuration coupled to the feedback loop and including a voltage clamping diode for speeding up the fall time by clamping the transistor to a clamping voltage.

References Cited by the Examiner

UNITED STATES PATENTS 2,951,953 9/1960 Dearden ............ 307—88.5

FOREIGN PATENTS 215,148 11/1957 Australia.

ARTHUR GAUSS, *Primary Examiner.*